(12) United States Patent
Chen et al.

(10) Patent No.: US 12,550,796 B2
(45) Date of Patent: Feb. 10, 2026

(54) ELECTRONIC PACKAGE AND FABRICATING METHOD THEREOF

(71) Applicant: AaltoSemi Inc., Suzhou (CN)

(72) Inventors: Yin-Ju Chen, Suzhou (CN); Min-Yao Chen, Suzhou (CN); Sung-Kun Lin, Suzhou (CN); Andrew C. Chang, Suzhou (CN)

(73) Assignee: AaltoSemi Inc., Jiangsu (CN)

(*) Notice: Subject to any disclaimer, the term of this patent is extended or adjusted under 35 U.S.C. 154(b) by 6 days.

(21) Appl. No.: 18/826,815

(22) Filed: Sep. 6, 2024

(65) Prior Publication Data

US 2025/0087572 A1 Mar. 13, 2025

(30) Foreign Application Priority Data

Sep. 8, 2023 (CN) .................. 202311163617.0

(51) Int. Cl.
*H01L 23/498* (2006.01)
*H01L 21/48* (2006.01)
(Continued)

(52) U.S. Cl.
CPC .... *H01L 23/49833* (2013.01); *H01L 21/4857* (2013.01); *H01L 23/3107* (2013.01); *H01L 23/49816* (2013.01); *H01L 23/49822* (2013.01); *H01L 24/19* (2013.01); *H01L 24/20* (2013.01); *H01L 24/16* (2013.01); *H01L 24/32* (2013.01); *H01L 24/73* (2013.01); *H01L 25/105* (2013.01); *H01L 2224/16227* (2013.01); *H01L 2224/19* (2013.01); *H01L 2224/2101* (2013.01); *H01L 2224/32225* (2013.01); *H01L 2224/73204* (2013.01); *H01L 2224/73259* (2013.01); *H01L 2224/73267* (2013.01); *H01L 2225/1041* (2013.01)

(58) Field of Classification Search
CPC ............ H01L 23/5239; H01L 23/5383; H01L 23/5384; H01L 21/76801
See application file for complete search history.

(56) References Cited

U.S. PATENT DOCUMENTS

| 2017/0064835 A1* | 3/2017 | Ishihara ............... H05K 3/4697 |
| 2022/0068814 A1 | 3/2022 | Kim et al. |
| 2023/0124000 A1* | 4/2023 | Wang .................. H01L 23/5386 257/737 |

FOREIGN PATENT DOCUMENTS

| CN | 114121924 A | 3/2022 |
| TW | I605554 B | 11/2017 |

* cited by examiner

*Primary Examiner* — David A Zarneke
(74) *Attorney, Agent, or Firm* — Jose Cherson Weissbrot (57) ABSTRACT

Provided is an electronic package, in which an external connection structure is formed on a first side of a circuit structure, at least one circuit assembly electrically connected to the circuit structure and at least one electronic element electrically connected to the circuit structure are disposed on a second side of the circuit structure, and the circuit assembly and the electronic element are encapsulated by a cladding layer. The coefficients of thermal expansion (CTEs) of the circuit assembly and the cladding layer are both greater than the CTE of the circuit structure, and the CTE of the circuit structure is greater than the CTE of the external connection structure, so as to prevent the difference in CTEs between the first side and the second side of the circuit structure from being significantly changed, thereby preventing the electronic package from warpage.

10 Claims, 6 Drawing Sheets

(51) Int. Cl.
*H01L 23/00* (2006.01)
*H01L 23/31* (2006.01)
*H01L 25/10* (2006.01)

ELECTRONIC PACKAGE AND FABRICATING METHOD THEREOF

BACKGROUND

1. Technical Field

The present disclosure relates to a semiconductor package fabricating process, and more particularly, to an electronic package, a package substrate thereof and a fabricating method thereof which can prevent warpage during a fabricating process.

2. Description of Related Art

With the booming development of the electronics industry, electronic products tend to be thin, light and short in form, while the functionality is developing towards high-performance, high-function and high-speed.

Currently, there are many technologies applied in the field of chip packaging, such as chip scale package (CSP), direct chip attach (DCA), multi-chip module (MCM), etc.

Figure 1:
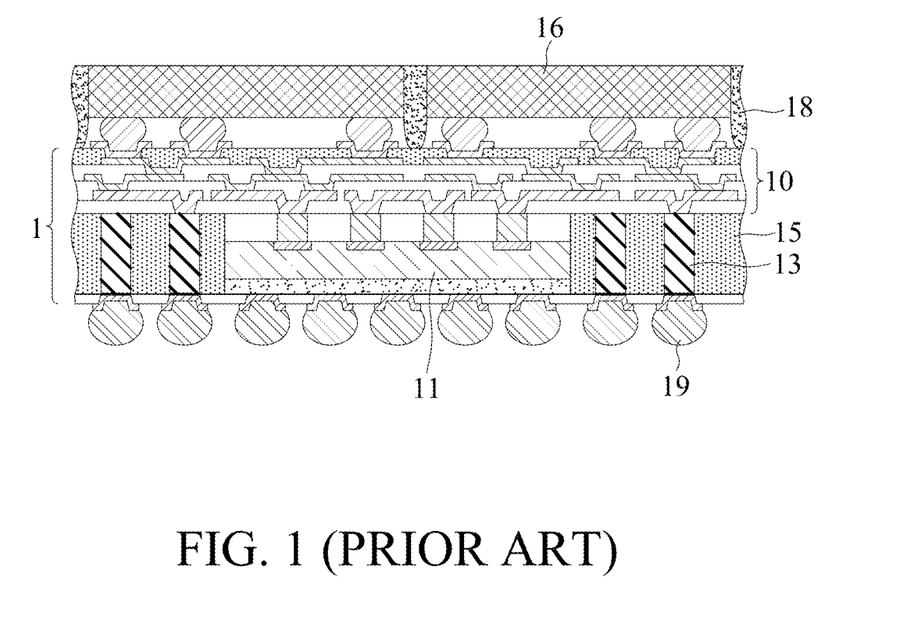
FIG. 1 is a schematic cross-sectional view showing a prior art method of fabricating a semiconductor package.

FIG. 1 is a schematic cross-sectional view showing a semiconductor package 1 in which prior art wafer-level packaging technology is used. As shown in FIG. 1, the semiconductor package 1 includes: a cladding layer 15, a semiconductor chip 11 embedded in the cladding layer 15, a plurality of conductive pillars 13 embedded in the cladding layer 15 and a wiring structure 10 disposed on the cladding layer 15. The wiring structure 10 is electrically connected to the semiconductor chip 11 and the conductive pillars 13, and a plurality of solder balls 19 are formed on the lower side of the conductive pillars 13 to bond to a circuit board (not shown), wherein the upper side of the wiring structure 10 can be configured with a package module including semiconductor chips 16 and an encapsulation layer 18 encapsulating the semiconductor chips 16, as required.

In the fabricating process of the prior art semiconductor package 1, the conductive pillars 13 need to penetrate through the cladding layer 15, and thus the perforations penetrating through the cladding layer 15 need to be formed by laser first, and then copper pillars are electroplated in the perforations, respectively.

However, the cladding layer 15 needs to cover the semiconductor chip 11, so the cladding layer 15 needs to have a certain thickness, resulting in a certain depth of the perforations required for the conductive pillars 13, and thus the perforations under laser burning will produce wider perforations, resulting in a lower aspect ratio (e.g., a lower depth-to-width ratio) for the conductive pillars 13, and thus not being able to lay out high-density conductive pillars 13.

Furthermore, the insulating layer of the wiring structure 10 is made of Ajinomoto build-up film (ABF), which causes the difference in CTEs (coefficients of thermal expansion) between the wiring structure 10 and the cladding layer 15 to change too much. Therefore, during the fabricating process, when the semiconductor package 1 undergoes multiple processes where the environmental temperature changes, due to insufficient strength of the wiring structure 10, the semiconductor package 1 is prone to deformation and warping, thereby leading to problems such as detachment or fragmentation of the solder balls 19.

Therefore, how to overcome the various problems of the above-mentioned prior art has become an urgent issue to be solved.

SUMMARY

In view of the various shortcomings of the prior art, the present disclosure provides an electronic package, which comprises: a circuit structure having a first side and a second side opposing the first side, and comprising at least a first dielectric layer and a first circuit layer formed on the first dielectric layer; an external connection structure disposed on the first side of the circuit structure, and comprising a second dielectric layer formed on the first dielectric layer and a plurality of conductors embedded in the second dielectric layer and electrically connected to the first circuit layer, wherein a coefficient of thermal expansion of the first dielectric layer is greater than a coefficient of thermal expansion of the second dielectric layer; a circuit assembly disposed on the second side of the circuit structure and electrically connected to the first circuit layer, and comprising an insulating film having a plurality of perforations and a conductive layer formed in the perforations, wherein the conductive layer is in contact with and electrically connected to the first circuit layer, and a coefficient of thermal expansion of the insulating film is greater than the coefficient of thermal expansion of the first dielectric layer; an electronic element disposed on the second side of the circuit structure and electrically connected to the first circuit layer; and a cladding layer formed on the second side of the circuit structure and covering the circuit assembly and the electronic element, wherein the conductive layer is exposed from the cladding layer, and a coefficient of thermal expansion of the cladding layer is greater than the coefficient of thermal expansion of the first dielectric layer.

The present disclosure further provides a method of fabricating an electronic package, and the method comprises: providing a coreless circuit structure, wherein the circuit structure has a first side and a second side opposing the first side, and comprises at least a first dielectric layer and a first circuit layer formed on the first dielectric layer; forming an external connection structure on the first side of the circuit structure, wherein the external connection structure comprises a second dielectric layer formed on the first dielectric layer and a plurality of conductors embedded in the second dielectric layer and electrically connected to the first circuit layer, and a coefficient of thermal expansion of the first dielectric layer is greater than a coefficient of thermal expansion of the second dielectric layer; forming a circuit assembly on the second side of the circuit structure to electrically connect the circuit assembly to the first circuit layer, wherein the circuit assembly comprises an insulating film having a plurality of perforations and a conductive layer formed in the perforations, and the conductive layer is in contact with and electrically connected to the first circuit layer, wherein a coefficient of thermal expansion of the insulating film is greater than the coefficient of thermal expansion of the first dielectric layer; disposing an electronic element on the second side of the circuit structure to electrically connect the electronic element to the first circuit layer; and forming a cladding layer on the second side of the circuit structure to cover the circuit assembly and the electronic element, wherein the conductive layer is exposed from the cladding layer, and a coefficient of thermal expansion of the cladding layer is greater than the coefficient of thermal expansion of the first dielectric layer.

In the aforementioned electronic package and method, the coefficient of thermal expansion of the insulating film is greater than the coefficient of thermal expansion of the cladding layer.

In the aforementioned electronic package and method, each of the perforations is provided with a conductive element electrically connecting the conductive layer to the first circuit layer.

In the aforementioned electronic package and method, the present disclosure further comprises forming a second circuit layer on the cladding layer, wherein the second circuit layer is electrically connected to the conductive layer.

In the aforementioned electronic package and method, the present disclosure further comprises forming a second circuit layer on the second dielectric layer, wherein the second circuit layer is electrically connected to the plurality of conductors.

In view of the above, in the electronic package and fabricating method thereof of the present disclosure, the requirement of a high aspect ratio (e.g., a high depth-to-width ratio) of the conductive layer in the cladding layer can be met by means of the configuration of the circuit assembly. Therefore, compared with the prior art, the fabricating method of the present disclosure does not need to drill holes on the cladding layer to obtain the desired conductive path by means of the conductive layer, thereby allowing for high-density perforations to be laid out.

Furthermore, the coefficients of thermal expansion (CTEs) of sub-layers of the electronic package are configured in a gradual increase or a gradual decrease manner, that is, the first side of the circuit structure is configured with the second dielectric layer which has the smallest CTE, and the second side of the circuit structure is configured with the insulating film which has the largest CTE, so as to avoid the CTE difference between the first side and the second side of the circuit structure from changing too much. Therefore, compared with the prior art, after the electronic package has gone through several processes of environmental temperature changes, the insulating film can be used as a stress-strengthening structure to effectively prevent the electronic package from deformation and warpage, thereby preventing the solder balls from being detached or cracked.

DETAILED DESCRIPTION

The following describes the implementation of the present disclosure with examples. Those skilled in the art can easily understand other advantages and effects of the present disclosure from the content disclosed in this specification.

It should be understood that, the structures, ratios, sizes, and the like in the accompanying figures are used for illustrative purposes to facilitate the perusal and comprehension of the content disclosed in the present specification by one skilled in the art, rather than to limit the conditions for practicing the present disclosure. Any modification of the structures, alteration of the ratio relationships, or adjustment of the sizes without affecting the possible effects and achievable proposes should still be deemed as falling within the scope defined by the technical content disclosed in the present specification. Meanwhile, terms such as "on," "first," "second," "a," "one" and the like are merely used for clear explanation rather than limiting the practicable scope of the present disclosure, and thus, alterations or adjustments of the relative relationships thereof without essentially altering the technical content should still be considered in the practicable scope of the present disclosure.

FIG. 2A to FIG. 2H are schematic cross-sectional views showing a method of fabricating an electronic package 2 according to an embodiment of the present disclosure.

Figure 2A:
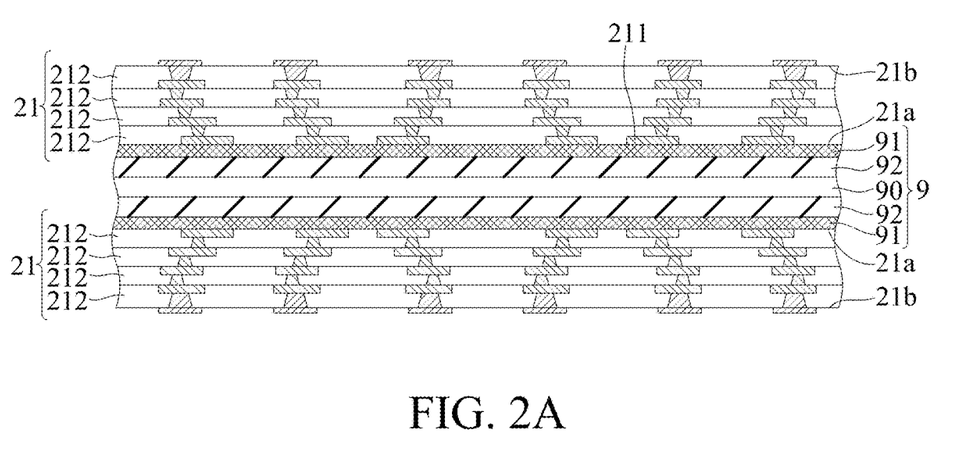
FIG. 2A to FIG. 2H are schematic cross-sectional views showing a method of fabricating an electronic package according to an embodiment of the present disclosure.

As shown in FIG. 2A, a carrier 9 is provided to symmetrically form a circuit structure 21 on each of the opposite sides of the carrier 9.

In an embodiment, the carrier 9 is a temporary carrier plate, which may be a plate having a metal layer on each of the opposite sides, such as a copper foil substrate. Each of the surfaces of a plate body 90 of the carrier 9 has a metal layer 92 on which a seed layer 91 is formed.

Moreover, the circuit structure 21 includes a plurality of first dielectric layers 212 and a plurality of first circuit layers 211 formed on the plurality of first dielectric layers 212 (e.g., at least one first circuit layer 211 is formed on each of the plurality of first dielectric layers 212), such that portions of the first circuit layers 211 of the circuit structure 21 are exposed from the first dielectric layer 212 on the second side 21b. For example, the first circuit layers 211 are formed in accordance with a redistribution layer (RDL) specification, and the first dielectric layers 212 are Ajinomoto build-up films (ABFs) and are made of a dielectric material with a coefficient of thermal expansion (CTE) of 13 ppm/° C. to 17 ppm/° C.

Also, each of the circuit structures 21 is coreless and has a first side 21a and a second side 21b opposing the first side 21a, and the circuit structure 21 is bonded to the seed layer 91 via the first side 21a.

In addition, each of the first circuit layers 211 is fabricated by a build-up process using electroplated metal (e.g., copper) or other means with a line width/line spacing (L/S) of about 10/10 micrometers (μm). For example, the innermost first circuit layer 211 is electroplated and formed via the seed layer 91. It should be appreciated that by using the build-up method, the circuit structure 21 can be designed with the number of layers of the first dielectric layer 212 according to the demand, so as to fabricate the desired number of layers of the first circuit layer 211.

Figure 2B:
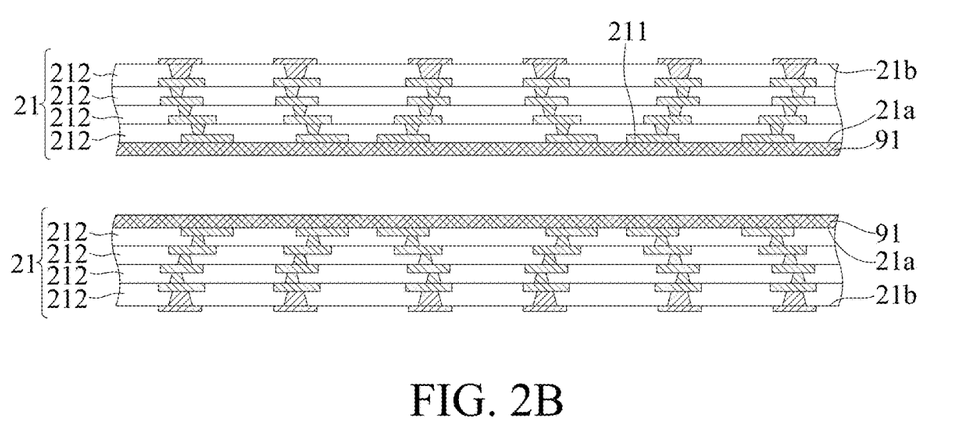

As shown in FIG. 2B, the plate body 90 and the metal layer 92 thereon are removed to retain the seed layer 91 on the first side 21a of the circuit structure 21.

Figure 2C:
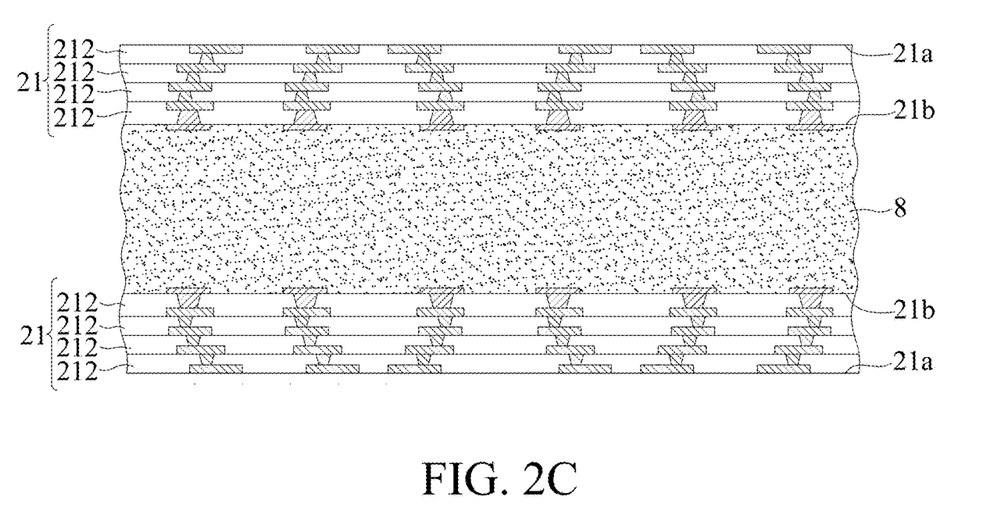

As shown in FIG. 2C, a support member 8 is provided to symmetrically bond the circuit structure 21 on each of the opposite sides of the support member 8 such that the seed layer 91 is exposed. Subsequently, the seed layer 91 is removed such that the first side 21a of the circuit structure 21 is exposed.

In an embodiment, the support member 8 is a thermal release film, and the second side 21b of the circuit structure 21 is pressed onto the support member 8. For example, a first circuit layer 211 of the second side 21b of the circuit structure 21 is embedded in the support member 8.

Figure 2D:
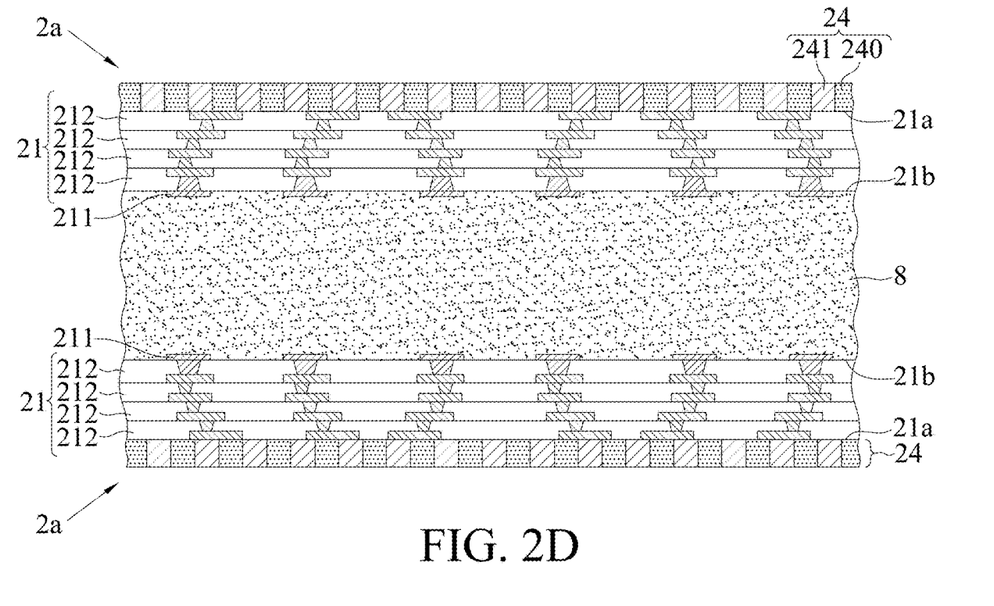

As shown in FIG. 2D, an external connection structure 24 is formed on the first side 21a of the circuit structure 21 to serve as a package substrate 2a.

In an embodiment, the external connection structure 24 includes a second dielectric layer 240 formed on the first dielectric layer 212, and a plurality of conductors 241 bonded to the second dielectric layer 240, wherein the conductors 241 are electrically connected to the first circuit layer 211. For example, the external connection structure 24 is made by a patterned process to form a plurality of openings in the second dielectric layer 240 by exposure and development, and then the conductors 241 are electroplated and formed in these openings. Accordingly, the conductors 241 can be copper pillars of RDL specification and embedded in the second dielectric layer 240 such that the surface of each of the conductors 241 is flush with or lower than the surface of the second dielectric layer 240.

Further, the second dielectric layer 240 is made of polybenzoxazole (PBO), polyimide (PI), prepreg (PP) with glass fiber, or other dielectric materials. For example, the second dielectric layer 240 is made of a PP material with a CTE of 10 ppm/° C.

Figure 2E:
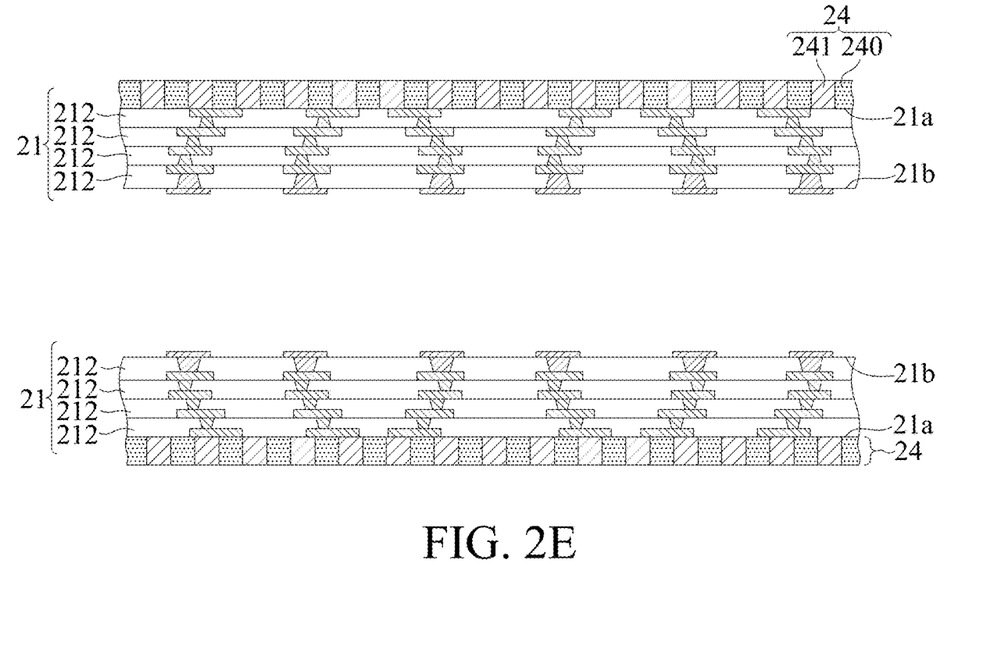

As shown in FIG. 2E, the support member 8 is heated to separate the support member 8 from the package substrate 2a.

In an embodiment, a thermal release film is used as the support member 8 to configure the circuit structure 21 on each of the opposite sides of the support member 8 to facilitate mass production.

Figure 2F:
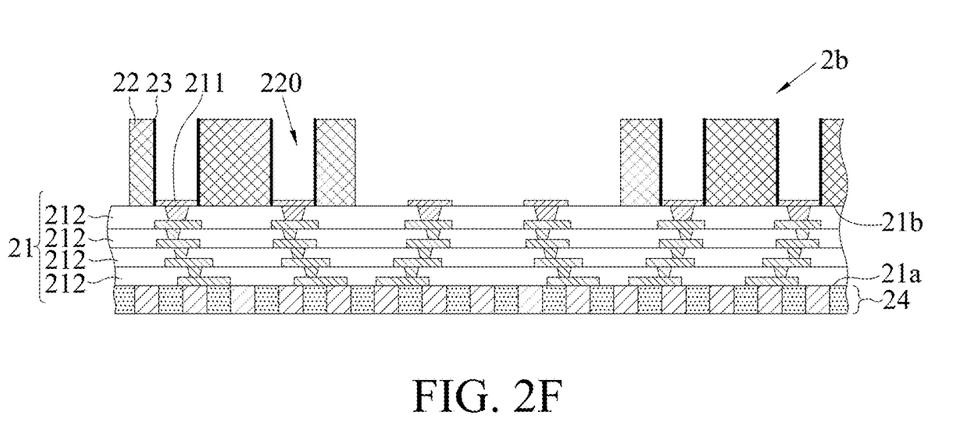

As shown in FIG. 2F, at least one circuit assembly 2b is provided on a portion of the surface of the second side 21b of the circuit structure 21 to electrically connect the circuit assembly 2b to the first circuit layer 211.

In an embodiment, the circuit assembly 2b includes an insulating film 22 (e.g., an insulating film body) having a plurality of perforations 220 and a conductive layer 23 formed in each of the perforations 220 to electrically connect the first circuit layer 211 by contacting the conductive layer 23 with the first circuit layer 211. For example, the insulating film 22 is made of a dielectric material such as a PI material, that is, a plurality of PI films are stacked on top of each other, and then the plurality of perforations 220 are formed by machine drilling, and after that copper is electroplated on the wall of each of the perforations 220 to serve as the conductive layer 23 to complete the circuit assembly 2b.

Further, the circuit assembly 2b is first fabricated, and then the circuit assembly 2b is bonded to the first dielectric layer 212 such that portions of the surface of the first circuit layer 211 are exposed from the perforations 220.

In addition, the material used to form the second dielectric layer 240 is different from the material used to form the insulating film 22. For example, the insulating film 22 is made of a PI material with a CTE of 40 ppm/° C.

Figure 2G:
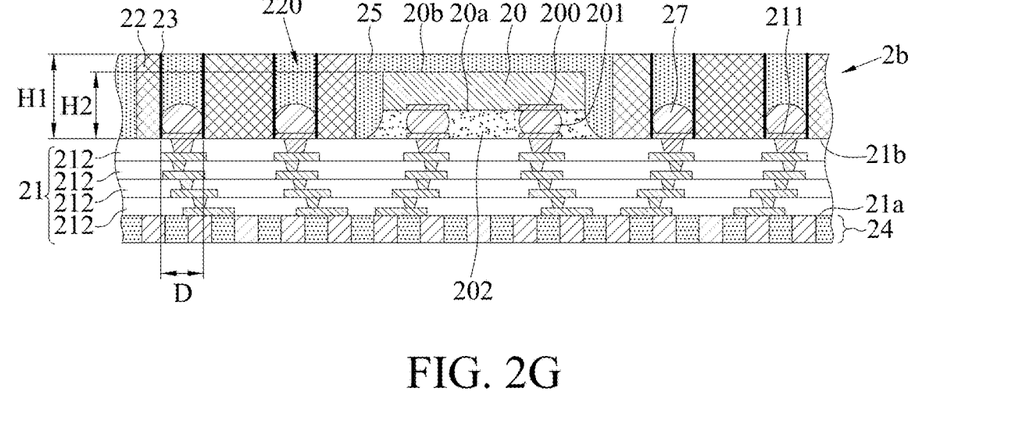

As shown in FIG. 2G, at least one electronic element 20 is disposed on a portion of the surface of the second side 21b of the circuit structure 21, and a cladding layer 25 is subsequently formed on the second side 21b of the circuit structure 21 such that the cladding layer 25 covers the circuit assembly 2b and the electronic element 20, and the conductive layer 23 is exposed from the cladding layer 25.

The electronic element 20 is an active element, a passive element, or a combination of the active element and the passive element, wherein the active element is, for example, a semiconductor chip, and the passive element is, for example, a resistor, a capacitor, or an inductor.

In an embodiment, the electronic element 20 is a semiconductor chip having an active surface 20a and an inactive surface 20b opposing the active surface 20a. The active surface 20a has a plurality of electrode pads 200, such that the electrode pads 200 of the active surface 20a of the electronic element 20 (where the electronic element 20 is disposed in a flip-chip manner) are electrically connected to the first circuit layer 211 via a plurality of conductive bumps 201 made of solder material (e.g., solder paste or solder balls), and the conductive bumps 201 can be covered by an underfill 202 as desired.

Further, the perforation 220 may be configured with a single conductive element 27 made of a solder material (solder paste or solder ball) such that the conductive element 27 contacts the first circuit layer 211 and the conductive layer 23, and the conductive element 27 serves as a soldering post with a lower height (i.e., lower than the perforation 220). For example, the conductive element 27 in the solder ball state can be placed onto the first circuit layer 211 in the perforation 220, and then the conductive bump 201 and the conductive element 27 are back-soldered such that the conductive element 27 in the back-soldered state contacts the conductive layer 23, wherein the width D of the perforation 220 is 35 μm, which is larger than the ball diameter of the conductive element 27 in the solder ball state (e.g., 25 μm) to facilitate the placement of the conductive element 27 in the solder ball state.

Also, the height H1 of the circuit assembly 2b with respect to the first dielectric layer 212 on the second side 21b of the circuit structure 21 is higher than the height H2 of the electronic element 20 with respect to the first dielectric layer 212 on the second side 21b of the circuit structure 21 such that the circuit assembly 2b has a high aspect ratio (e.g., a high depth-to-width ratio) to meet the high aspect ratio requirement of the conductive layer 23 in the cladding layer 25.

The cladding layer 25 is made of an insulating material, such as polyimide (PI), dry film, epoxy, or other molding compound, and the cladding layer 25 can be laminated or molded on the second side 21b of the circuit structure 21. For example, the cladding layer 25 is made of an epoxy molding compound (EMC) with a CTE of 10 ppm/° C. to 25 ppm/° C.

In an embodiment, a portion of the material of the cladding layer 25 may be removed by a leveling process (such as etching or grinding), such that the surface of the top side of the cladding layer 25 is flush with the surface of the circuit assembly 2b (or the insulating film 22). For example, the cladding layer 25 is filled into the perforation 220 to enclose the conductive element 27, and the cladding layer 25 covers the inactive surface 20b of the electronic element 20 such that the electronic element 20 is not exposed from the cladding layer 25.

Figure 2H:
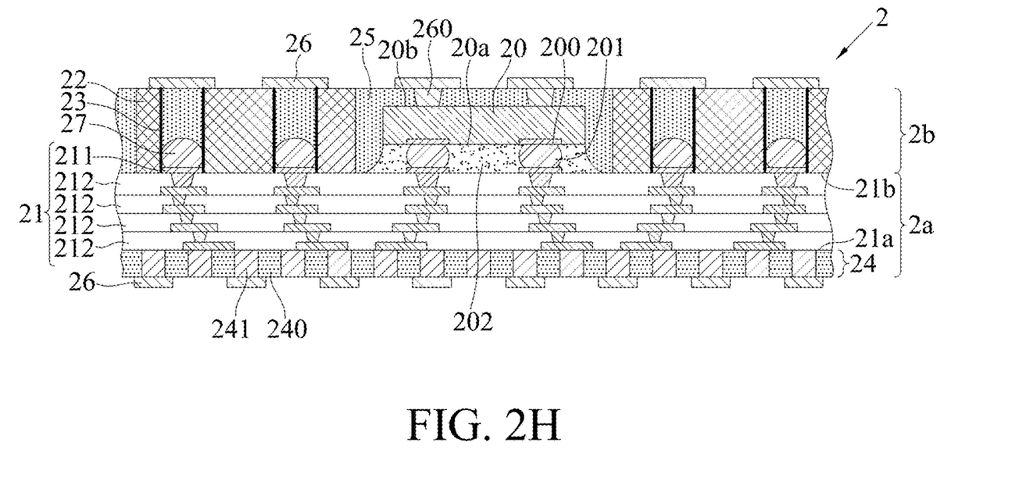

As shown in FIG. 2H, a second circuit layer 26 is formed on the cladding layer 25 and the insulating film 22 such that the second circuit layer 26 is electrically connected to the conductive layer 23 to form the electronic package 2.

The second circuit layer 26 extends into the cladding layer 25 to form a conductive blind via 260 such that the conductive blind via 260 contacts the inactive surface 20b of the electronic element 20 for grounding or heat dissipation of the electronic element 20.

Figure 3:
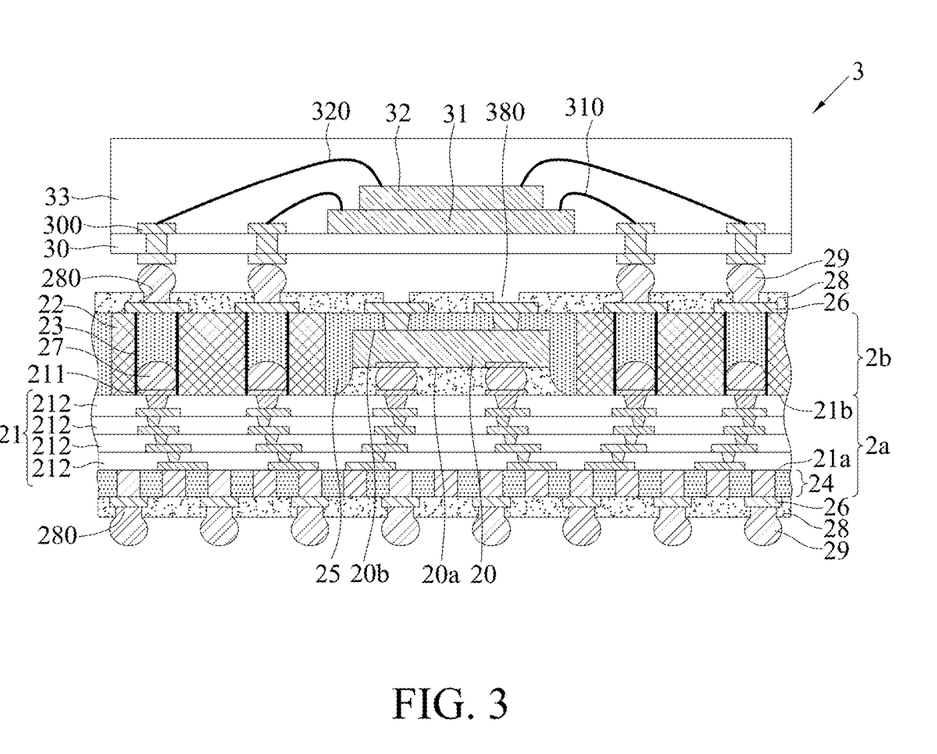
FIG. 3 is a schematic cross-sectional view showing the subsequent fabricating process of FIG. 2H.

In an embodiment, an insulating protective layer 28 made of such as a solder-resistant material may be formed on the cladding layer 25 and the insulating film 22, as shown in FIG. 3, and the insulating protective layer 28 has a plurality of openings 280, 380 exposing the second circuit layer 26 to form a plurality of solder balls 29 (such as solder balls with tin) on the second circuit layer 26 in some of the openings 280 to receive a package module 3. For example, some of the openings 380 of the insulating protective layer 28 which fluidly communicate with outside serve as heat dissipation holes to correspond to and communicate with the inactive surface 20b of the electronic element 20.

Further, the package module 3 includes a carrier substrate 30 having wiring layers 300, a plurality of semiconductor chips 31, 32 stacked on the carrier substrate 30, and an encapsulation layer 33 covering the semiconductor chips 31, 32, wherein the semiconductor chips 31, 32 are electrically connected to the wiring layers 300. For example, the semiconductor chips 31, 32 are electrically connected to the wiring layers 300 via a plurality of conductive wires 310, 320, respectively in a wire bonding manner. It should be appreciated that the variety of the package module 3 is not limited to the above.

Alternatively, the second circuit layer 26 may be formed on the second dielectric layer 240 of the external connection structure 24 as required such that the second circuit layer 26 is electrically connected to the conductors 241. Further, an insulating protective layer 28 made of such as a solder-resistant material may be formed on the external connection structure 24 and the second circuit layer 26, such that the second circuit layer 26 is exposed from the openings 280 of the insulating protective layer 28 and is bonded to the plurality of solder balls 29, and the electronic package 2 can be mounted on a circuit board (not shown) via the plurality of solder balls 29.

Therefore, the fabricating method of the present disclosure mainly utilizes the fabricating method of the circuit assembly 2b, such as stacking the plurality of PI films and forming the conductive layer 23, to meet the requirement of high aspect ratio of the conductive layer 23 in the cladding layer 25. Therefore, compared to the prior art, the fabricating method of the present disclosure does not require drilling on the cladding layer 25, and the required conductive path can be obtained from the conductive layer 23, thereby allowing for the deployment of high-density perforations 220.

Further, the insulating film 22 of the circuit assembly 2b is made of a material having a very high glass transition temperature (Tg), such as PP, to ensure that the circuit assembly 2b acts as the desired thermal resistance.

Also, in the electronic package 2, the circuit structure 21 is coreless so that a thinner package substrate 2a can be obtained.

In addition, the CTEs of sub-layers of the electronic package 2 are configured in a gradual increase or a gradual decrease manner (i.e., the CTE of the cladding layer 25 made with EMC is the second largest, the CTE of the first dielectric layer 212 made with ABF is the second smallest, the CTE of the second dielectric layer 240 made with PP is the smallest, and the CTE of the insulating film 22 made with PI is the largest), so as to avoid an excessive change in the CTEs of the circuit structure 21 between the first side 21a and the second side 21b. As such, compared to the prior art, when the electronic package 2 undergoes multiple processes of environmental temperature changes, the insulating film 22 can serve as a stress-strengthening structure to effectively prevent the electronic package 2 from deformation and warping, thereby preventing the solder balls 29 from being detached or cracked.

The present disclosure also provides an electronic package 2, which comprises: a circuit structure 21, an external connection structure 24, at least one circuit assembly 2b, at least one electronic element 20, and a cladding layer 25.

The circuit structure 21 has a first side 21a and a second side 21b opposing the first side 21a, wherein the circuit structure 21 includes at least one first dielectric layer 212 and at least one first circuit layer 211 formed on the first dielectric layer 212.

The external connection structure 24 is disposed on the first side 21a of the circuit structure 21, wherein the external connection structure 24 includes a second dielectric layer 240 formed on the first dielectric layer 212, and conductors 241 embedded in the second dielectric layer 240 and electrically connected to the first circuit layer 211, wherein the coefficient of thermal expansion of the first dielectric layer 212 is greater than the coefficient of thermal expansion of the second dielectric layer 240.

The circuit assembly 2b is disposed on the second side 21b of the circuit structure 21 and electrically connected to the first circuit layer 211, wherein the circuit assembly 2b includes an insulating film 22 having a plurality of perforations 220 and a conductive layer 23 formed in the perforations 220, wherein the conductive layer 23 is in contact with and electrically connected to the first circuit layer 211, and a coefficient of thermal expansion of the insulating film 22 is greater than a coefficient of thermal expansion of the first dielectric layer 212.

The electronic element 20 is disposed on the second side 21b of the circuit structure 21 and electrically connected to the first circuit layer 211.

The cladding layer 25 is formed on the second side 21b of the circuit structure 21 and covers the circuit assembly 2b and the electronic element 20, and the conductive layer 23 is exposed from the cladding layer 25, wherein a coefficient of thermal expansion of the cladding layer 25 is greater than the coefficient of thermal expansion of the first dielectric layer 212.

In an embodiment, the coefficient of thermal expansion of the insulating film 22 is greater than the coefficient of thermal expansion of the cladding layer 25.

In an embodiment, each of the perforations 220 is provided with a conductive element 27 electrically connecting the conductive layer 23 to the first circuit layer 211.

In an embodiment, the electronic package 2 further includes a second circuit layer 26 formed on the cladding layer 25 and electrically connected to the conductive layer 23.

In an embodiment, the electronic package 2 further includes a second circuit layer 26 formed on the second dielectric layer 240 and electrically connected to the conductors 241.

In summary, in the electronic package and fabricating method thereof of the present disclosure, the requirement of high aspect ratio of the conductive layer in the cladding layer can be met by means of the configuration of the circuit assembly, such that the fabricating method of the present disclosure does not require drilling on the cladding layer to obtain desired conductive path by means of the conductive layer, thereby allowing for high-density perforations to be laid out.

Furthermore, the coefficients of thermal expansion (CTEs) of sub-layers of the electronic package are configured in a gradual increase or a gradual decrease manner, that is, the first side of the circuit structure is configured with the second dielectric layer which has the smallest CTE, and the second side of the circuit structure is configured with the insulating film which has the largest CTE, so as to avoid the CTE difference between the first side and the second side of the circuit structure from changing too much. Therefore, compared with the prior art, after the electronic package has gone through several processes of environmental temperature changes, the insulating film can be used as a stress-strengthening structure to effectively prevent the electronic package from deformation and warpage.

The above embodiments are provided for illustrating the principles of the present disclosure and its technical effect, and should not be construed as to limit the present disclosure in any way. The above embodiments can be modified by one of ordinary skill in the art without departing from the spirit and scope of the present disclosure. Therefore, the scope claimed of the present disclosure should be defined by the following claims.

What is claimed is:

1. An electronic package, comprising:
a circuit structure having a first side and a second side opposing the first side, and comprising at least a first dielectric layer and a first circuit layer formed on the first dielectric layer;
an external connection structure disposed on the first side of the circuit structure, and comprising a second dielectric layer formed on the first dielectric layer and a plurality of conductors embedded in the second dielectric layer and electrically connected to the first circuit layer, wherein a coefficient of thermal expansion of the first dielectric layer is greater than a coefficient of thermal expansion of the second dielectric layer;
a circuit assembly disposed on the second side of the circuit structure and electrically connected to the first circuit layer, and comprising an insulating film having a plurality of perforations and a conductive layer formed on the walls of the perforations, wherein the conductive layer is in contact with and electrically connected to the first circuit layer, and a coefficient of thermal expansion of the insulating film is greater than the coefficient of thermal expansion of the first dielectric layer;
an electronic element disposed on the second side of the circuit structure and electrically connected to the first circuit layer; and
a cladding layer is filled into the perforations, and formed on the second side of the circuit structure and covering the circuit assembly and the electronic element, wherein the conductive layer is exposed from the cladding layer, and a coefficient of thermal expansion of the cladding layer is greater than the coefficient of thermal expansion of the first dielectric layer.

2. The electronic package of claim 1, wherein the coefficient of thermal expansion of the insulating film is greater than the coefficient of thermal expansion of the cladding layer.

3. The electronic package of claim 1, wherein each of the perforations is provided with a conductive element electrically connecting the conductive layer to the first circuit layer.

4. The electronic package of claim 1, further comprising a second circuit layer formed on the cladding layer and electrically connected to the conductive layer.

5. The electronic package of claim 1, further comprising a second circuit layer formed on the second dielectric layer and electrically connected to the conductors.

6. A method of fabricating an electronic package, comprising:
providing a coreless circuit structure, wherein the circuit structure has a first side and a second side opposing the first side, and comprises at least a first dielectric layer and a first circuit layer formed on the first dielectric layer;
forming an external connection structure on the first side of the circuit structure, wherein the external connection structure comprises a second dielectric layer formed on the first dielectric layer and a plurality of conductors embedded in the second dielectric layer and electrically connected to the first circuit layer, and a coefficient of thermal expansion of the first dielectric layer is greater than a coefficient of thermal expansion of the second dielectric layer;
forming a circuit assembly on the second side of the circuit structure to electrically connect the circuit assembly to the first circuit layer, wherein the circuit assembly comprises an insulating film having a plurality of perforations and a conductive layer formed on the walls of the perforations, and the conductive layer is in contact with and electrically connected to the first circuit layer, wherein a coefficient of thermal expansion of the insulating film is greater than the coefficient of thermal expansion of the first dielectric layer;
disposing an electronic element on the second side of the circuit structure to electrically connect the electronic element to the first circuit layer; and
filling the perforations with a cladding layer, and forming the cladding layer on the second side of the circuit structure to cover the circuit assembly and the electronic element, wherein the conductive layer is exposed from the cladding layer, and a coefficient of thermal expansion of the cladding layer is greater than the coefficient of thermal expansion of the first dielectric layer.

7. The method of claim 6, wherein the coefficient of thermal expansion of the insulating film is greater than the coefficient of thermal expansion of the cladding layer.

8. The method of claim 6, wherein each of the perforations is provided with a conductive element electrically connecting the conductive layer to the first circuit layer.

9. The method of claim 6, further comprising forming a second circuit layer on the cladding layer, wherein the second circuit layer is electrically connected to the conductive layer.

10. The method of claim 6, further comprising forming a second circuit layer on the second dielectric layer, wherein the second circuit layer is electrically connected to the conductors.

* * * * *